United States Patent [19]

Jecmen

[11] 4,198,250
[45] Apr. 15, 1980

[54] SHADOW MASKING PROCESS FOR FORMING SOURCE AND DRAIN REGIONS FOR FIELD-EFFECT TRANSISTORS AND LIKE REGIONS

[75] Inventor: Robert M. Jecmen, Sunol, Calif.
[73] Assignee: Intel Corporation, Santa Clara, Calif.
[21] Appl. No.: 9,303
[22] Filed: Feb. 5, 1979
[51] Int. Cl.² ............... H01L 21/265; H01L 21/31; H01L 7/54
[52] U.S. Cl. .................. 148/1.5; 148/187; 357/23; 357/59; 357/91
[58] Field of Search ............... 148/1.5, 187; 357/23, 357/59, 91

[56] References Cited

U.S. PATENT DOCUMENTS

| | | | |
|---|---|---|---|
| 3,823,352 | 7/1974 | Pruniaux | 357/23 |
| 3,851,379 | 12/1974 | Gutknecht | 29/571 |
| 4,052,229 | 10/1977 | Pashley | 148/1.5 |
| 4,060,427 | 11/1977 | Barile et al. | 148/1.5 |
| 4,084,987 | 4/1978 | Godber | 148/1.5 |
| 4,144,101 | 3/1979 | Rideout | 148/1.5 |
| 4,149,904 | 4/1979 | Jones | 148/1.5 |

OTHER PUBLICATIONS

Bratter et al., "Ion-Implanted Emitter Process . . ." IBM-TDB, 18 (1975) 1827.

*Primary Examiner*—L. Dewayne Rutledge
*Assistant Examiner*—Upendra Roy
*Attorney, Agent, or Firm*—Blakely, Sokoloff, Taylor & Zafman

[57] ABSTRACT

A process for substantially reducing the overlap between a gate and the source and drain regions of a field-effect transistor is disclosed. Lateral etching of a polysilicon gate provides overhangs which extend from a gate masking member. Source/drain regions are formed by ion implanting through the gate oxide layer. A small amount of dopant is implanted through the overhangs providing a low concentration of dopant in alignment with the gate. During subsequent processing, this low concentration of dopant does not substantially diffuse as do regions of higher concentration. Significant reduction in Miller capacitance is obtained along with improved punch-through characteristics.

9 Claims, 5 Drawing Figures

SHADOW MASKING PROCESS FOR FORMING SOURCE AND DRAIN REGIONS FOR FIELD-EFFECT TRANSISTORS AND LIKE REGIONS

BACKGROUND OF THE INVENTION

1. Field of the Invention

The invention relates to the field of shadow masking techniques, particularly those employed in MOS processors.

2. Prior Art

In the fabrication of integrated circuits such as metal-oxide-semiconductor (MOS) circuits, a masking pattern is often defined employing photolithographic techniques. This pattern is then used as a mask during subsequent etching of other layers. For example, in the fabrication of field-effect transistors, an oxide layer is commonly formed over a polysilicon layer. A photoresist is then used to define outlines of gates in the oxide layer. Then the oxide layer acts as a mask while the polysilicon layer is etched.

In these processing steps and similar steps, undercutting of the masking members often occurs since, for example, the polysilicon is side-etched or laterally etched and overhangs the polysilicon gate. These overhangs, which are found in masking oxides, silicon nitride layers, photoresist layers, and others, in some cases are useful.

In some processes, the overhangs are used to cast shadows during ion implantation. That is, the regions below the overhangs are masked from the ions by the overhangs. An example of this technique is described in U.S. Pat. No. 3,823,352, Column 4 beginning at line 32. Other patents describing use of overhangs and undercutting are U.S. Pat. Nos. 3,761,785; 3,851,379; 3,961,999; and 4,060,427. For the most part, these patents describe complicated processes, and particularly where overhangs are employed to completely block the implantation of impurities into underlying regions. This is most often done to obtain alignment with one or more circuit members.

With the presently described process, overhangs are used to only partially block the implantation of an impurity into the substrate. A substantial advantage is obtained with this technique since precise alignment with a gate results, as will be described.

SUMMARY OF THE INVENTION

An MOS process for forming source and drain regions in a substrate is disclosed. The substrate includes a gate oxide layer and a polysilicon layer disposed over the gate oxide layer. A masking member is formed on the polysilicon layer in a predetermined pattern to define the gate. Then, the polysilicon layer is etched, forming the gate. The etching is continued to undercut the masking member, thereby forming overhangs which extend from the masking member. Next, the substrate is subjected to ion implantation to form the source and drain regions by implanting through the gate oxide. The level of the implantation is selected so that a much lower concentration of impurities is implanted in the substrate beneath the overhangs than in the substrate region not protected by the masking member. During subsequent processing steps, the lower concentration of impurities does not substantially diffuse, thereby providing precise alignment between the gate and the source and drain regions. In this manner, the Miller capacitance is reduced, and in addition, improved punch-through characteristics result.

DETAILED DESCRIPTION OF THE INVENTION

An MOS process for forming source and drain regions in a substrate, or like regions, is described. In the following description, numerous specific details are set forth, such as specific concentration levels, gate widths, etc., in order to provide a thorough understanding of the present invention. However, it will be obvious to one skilled in the art that these specific details are not required to practice the invention. In other cases, well-known processing steps have not been described in detail in order not to obscure the present invention in unnecessary detail.

The described improved processing steps which comprise the present invention may be employed with a plurality of known MOS processes. In the presently preferred embodiment, these steps are employed with the MOS process described in U.S. Pat. No. 4,052,229. In the following description, well-known "front end" steps, such as the formation of field oxides, is not described.

Figure 1:
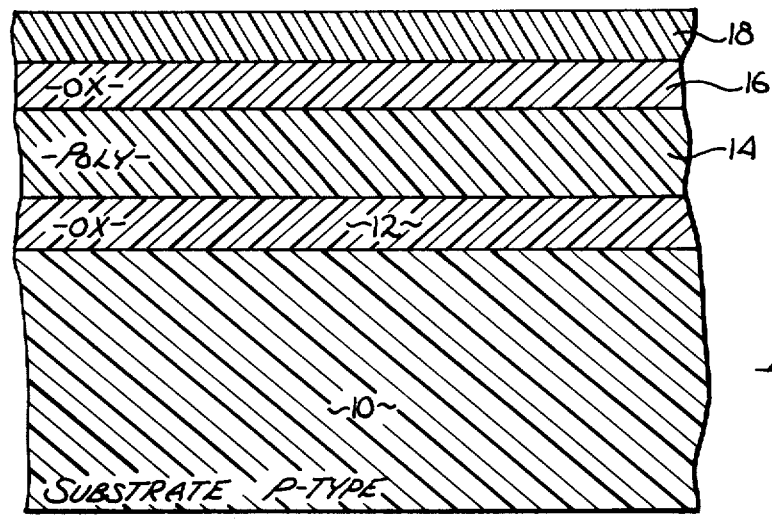
FIG. 1 is a cross-sectional elevation view of a substrate which includes a gate oxide layer, polysilicon layer, masking oxide layer and a photoresist layer.

In FIG. 1, a p-type monocrystalline silicon substrate 10, which in the presently preferred embodiment has an impurity concentration level of approximately 50 ohm-cm, is illustrated. An oxide (silicon dioxide) layer 12 is formed on this substrate. This oxide layer insulates the substrate from the gates of field-effect transistors and is thus referred to as a gate oxide layer. In the presently preferred embodiment, this gate oxide layer 12 is a thermally grown oxide of approximately 400 Å thick.

After the formation of the gate oxide layer 12, a layer of polycrystalline silicon (polysilicon) is formed over the gate oxide layer. This polysilicon layer, in the presently preferred embodiment, is approximately 5500 Å thick and is doped to enhance etching. An oxide layer 16 is formed on the polysilicon layer 14. This oxide layer is used for masking and, in the presently preferred embodiment, is approximately 800 Å thick. A photoresist layer 18 is then formed over the oxide layer 16.

Figure 2:
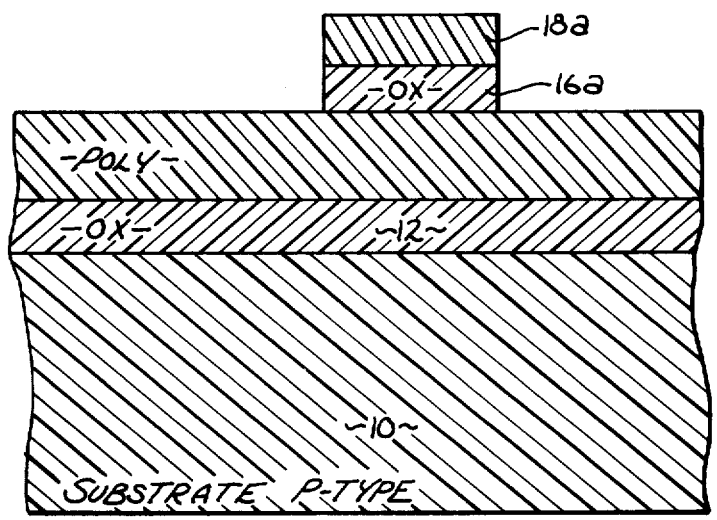
FIG. 2 illustrates the substrate of FIG. 1 after masking and etching which defines a gate oxide masking member.

Referring now to FIG. 2, using well-known photolithographic techniques to photoresist layer is masked and etched to define the mask 18a. Then the oxide layer 16 is etched to define a masking member 16a. In the presently preferred embodiment, the member 16a is used to define the gate of a field-effect transistor which has a width of approximately 3 microns. Following the formation of the masking member 16a, the photoresist 18a is removed.

Figure 3:
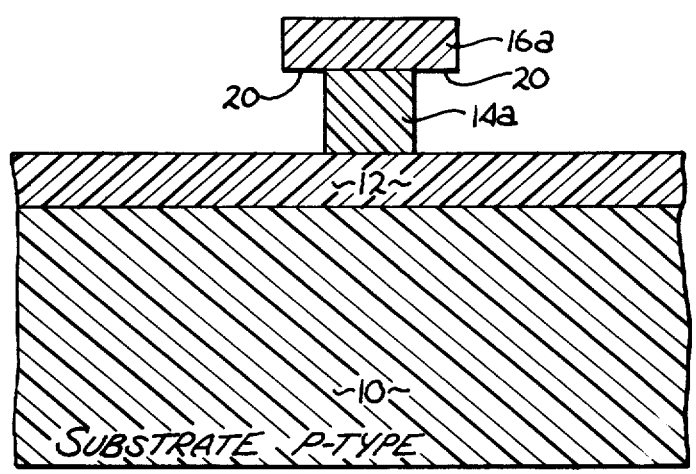
FIG. 3 illustrates the substrate of FIG. 2 after the polysilicon layer is etched, including the lateral etching used to form the overhangs.

Next, as shown in FIG. 3, the oxide masking member 16a is used to mask the polysilicon layer 14 during the etching of the polysilicon, thereby defining the gate 14a. This etching step is controlled in a well-known manner so that lateral etching beneath the member 16a occurs as shown in FIG. 3. This results in the overhangs 20 which overhang the gate 14a. In the presently preferred embodiment, these overhangs extend beyond the gate 14a a distance of approximately 0.5 microns (a gate width of 2 microns). A wet etching step is employed in the presently preferred embodiment to etch the polysilicon; however, it may be possible to achieve the same result with a non-directional plasma etching step.

Figure 4:
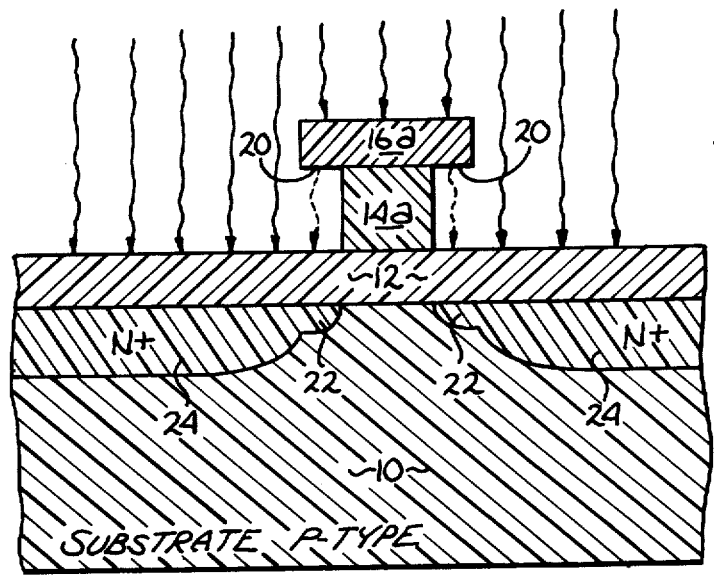
FIG. 4 illustrates the substrate of FIG. 3 during an ion implantation step which defines the source and drain regions.

Now, the substrate is subjected to ion implantation to define the source and drain regions of a field-effect transistor. In the presently preferred embodiment, an arsenic implantation is employed to define the n-type source/drain regions 22 and 24 of an n-channel device. Note that the source and drain regions are formed by ion implanting through the gate oxide layer 12. (This is a departure from the process described in U.S. Pat. No. 4,052,229 and effectively eliminates an etching step described in this patent, which etching defines openings in the gate oxide layer for doping of the source and drain regions.) The level of the ion implantation illustrated in FIG. 4 is controlled so that some implantation occurs through the overhangs 20 to form the more lightly doped extensions of the source/drain regions 22. As mentioned, the gate oxide layer 12 is approximately 400 Å thick and a high percentage of the arsenic is implanted into the substrate in the regions not protected by the masking member 16a. Under the overhangs 20, the ions must pass through the 800 Å-thick masking member 16a and then through the 400 Å of the gate oxide layer. As illustrated in FIG. 4, this results in regions 22 which contain substantially less dopant than the regions 24. In the presently preferred embodiment, this arsenic implantation occurs at an energy level of 125 Kev to obtain a concentration level of approximately $3 \times 10^{15}/cm^2$ in the regions 24. Approximately 90% of the arsenic ions pass through the 400 Å-thick gate oxide layer. However, only approximately 5% of these ions pass through the 1200 Å of oxide formed by the combination of the masking members 16a and the gate oxide layer 12.

It will be apparent to one skilled in the art that other thicknesses of oxides and other energy levels may be employed to obtain the above-described results. For example, the implantation could occur at an energy level of approximately 100 Kev. Then approximately 80% of the ions would pass through the 400 Å-thick gate oxide layer and approximately 0.5% pass through the 1200 Å of oxide.

As described, in the presently preferred embodiment the masking member 16a consists of an oxide member. Other masking members may be employed for the same purpose, that is, to provide a mask for the polysilicon during the formation of the gate, including the lateral etching and a partial barrier to the ions. For example, a silicon nitride layer may be employed or it may be possible to employ a thin photoresist layer.

In many prior art MOS processes, the source and drain regions are doped in alignment with a gate member (without significant overhangs). During subsequent high-temperature processing steps, such as reoxidation steps, the dopant in the source and drain regions is further diffused into the substrate and is diffused laterally beneath the gate. This diffusion beneath the gate causes an overlap between the source and drain regions and the gate. Increased parasitic capacitance results between the gate and these regions which decreases the high frequency response and speed of the transistor and is commonly referred to as Miller capacitance. Also, in some cases, the increased channel depth causes a deterioration in the punch-through characteristics of the transistor. The rate at which this diffusion occurs during subsequent high temperature steps is a function of the concentration levels of the dopant. Referring to FIG. 4, during subsequent processing steps, the more heavily doped regions 24 diffuse at a much greater rate than the more lightly doped regions 22.

Figure 5:
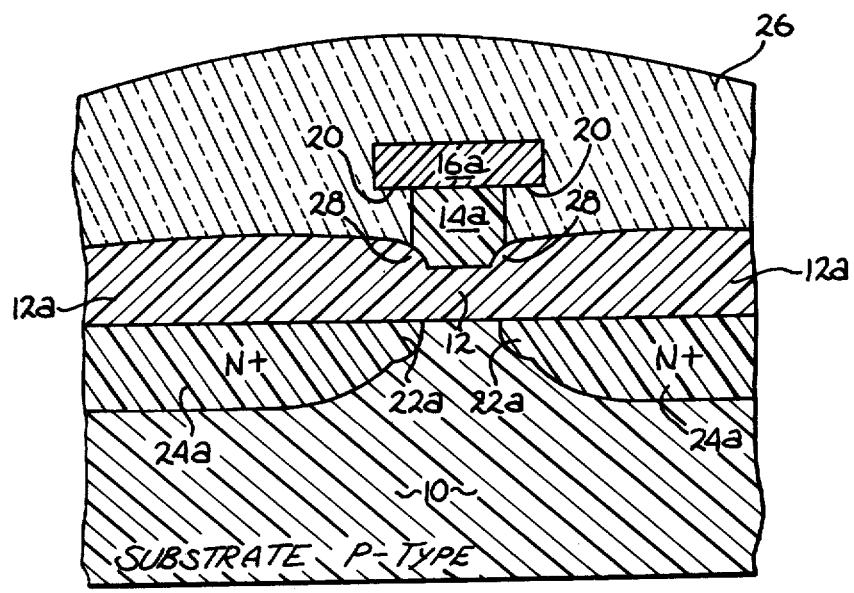
FIG. 5 illustrates the substrate of FIG. 4 after additional processing has occurred, including a reoxidation step.

In FIG. 5, during the subsequent high-temperature steps, the regions 24 of FIG. 4 diffuse and, as shown by the regions 24a, these regions laterally diffuse part-way under the overhangs 20. However, they do not diffuse sufficiently to overlap the gate 14a. The more lightly doped regions 22 of FIG. 4 diffuse very little because of their lower dopant concentration, and thus very little overlapping (approximately 0.25 microns) occurs between these regions and the gate 14a for the described process. These regions, after these high-temperature steps, are shown as regions 22a in FIG. 5.

It has been found that the effects of lateral diffusion of the regions 22a is minimized by the fact that the gate oxide above these regions is thickened during a reoxidation step. That is, the gate oxide at region 28, which is directly above the edges of regions 22a, is somewhat thicker than the gate oxide layer 12. With the above-described process, the Miller capacitance has been found to be $2 \times 10^{-4}$ pf/micron of gate length. This is a substantial improvement over the $5 \times 10^{-4}$ pf/micron of gate length common with some prior art processes.

As will be apparent to one skilled in the art, only a portion of a substrate is illustrated in FIGS. 1 through 5. During and between the processing described in conjunction with FIGS. 1 through 5, other processing may occur elsewhere on the substrate to form buried contact regions, and other members, as is commonly done in the fabrication of integrated circuits.

Thus, an improved process has been described for forming source and drain regions for a field-effect transistor. The process may be employed to obtain precise alignment between other circuit members and doped regions. The process eliminates etching step often employed in prior art processes since the source and drain regions are ion implanted through the gate oxide. The improved process reduces the Miller capacitance and provides improved punch-through characteristics.

I claim:

1. An MOS process for forming source and drain regions in a substrate which includes a gate oxide layer and polysilicon layer comprising the steps of:
   defining a masking member on said polysilicon layer in a predetermined pattern;
   etching said polysilicon layer to form a gate employing said masking member as a mask, said etching being permitted to continue so as to undercut said masking member thereby forming overhangs which overhang said gate;
   ion implanting said substrate to form said source and drain regions through said gate oxide, the dosage level of ions implanted being selected so that a lower concentration of impurities is implanted in substrate regions beneath said overhangs than in substrate regions not protected by said masking member;

whereby during subsequent processing steps, said lower concentration of impurities does not substantially diffuse, thereby providing more precise alignment between said gate and said source and drain regions.

2. The process defined by claim 1 wherein masking member is an oxide member.

3. The process defined by claim 2 wherein said ion implantation comprises arsenic implantation.

4. The process defined by claim 1 wherein said lower concentration of impurity is between 0.5% to 5% of the concentration level in said regions not protected by said masking member.

5. A process for forming an MOS field effect transistor on a substrate comprising the steps of:

forming a gate oxide layer on said substrate;
forming a layer of polysilicon over said gate oxide layer;
defining a masking member on said polysilicon layer in a predetermined shape;
etching said polysilicon layer employing said masking member as a mask to form a gate for said field-effect transistor, including etching said polysilicon layer under said masking member to form overhangs which overhang said gate and extend from said masking member;
ion implanting said substrate to form source and drain regions by ion implanting through said gate oxide, such that some implantation occurs in the substrate region beneath said overhangs, thereby forming more lightly doped source and drain regions beneath said overhangs and more heavily doped source and drain regions in substrate areas unprotected by said masking member;
whereby during subsequent processing steps, the lower concentration of impurities in said lightly doped source and drain regions does not substantially diffuse beneath said gate, thereby providing more precise alignment between said gate and said source and drain regions.

6. The process defined by claim 5 wheren said masking member is an oxide member.

7. The process defined by claim 6 wherein said ion implantation comprises arsenic implantation.

8. The process defined by claim 7 wherein said lower concentration of dopant in said more lightly doped source and drain regions is between 0.5% to 5% of the dopant concentration in said more heavily doped source and drain regions.

9. In a process for forming a doped region in a substrate which is in alignment with a circuit member, the improved steps comprising:

forming a masking member on a layer, said masking member defining the outline of said circuit member;
etching said layer employing said masking member as a mask to define said circuit member, said etching continuing such that said masking member overhangs said circuit member;
ion implanting an inpurity into said substrate so as to form said doped region, the dosage level of ions implanted being selected such that ions are partially blocked by the overhang, thereby providing a more lightly doped region beneath said overhang which is an extension of said doped region;
whereby in subsequent processing steps, said more lightly doped regions does not substantially diffuse beneath said circuit member.

* * * * *